(12) United States Patent
Kirchmeier et al.

(10) Patent No.: US 7,745,955 B2
(45) Date of Patent: Jun. 29, 2010

(54) RF PLASMA SUPPLY DEVICE

(75) Inventors: Thomas Kirchmeier, Teningen (DE);
Ekkehard Mann, Gundelfingen (DE);
Michael Glück, Freiburg (DE);
Christoph Hofstetter, Teningen (DE);
Christoph Gerhardt, Freiburg (DE);
Gerd Hintz, Pfaffenweiler (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 926 days.

(21) Appl. No.: 11/549,773

(22) Filed: Oct. 16, 2006

(65) Prior Publication Data

US 2007/0145900 A1 Jun. 28, 2007

Related U.S. Application Data

(60) Provisional application No. 60/729,949, filed on Oct. 25, 2005.

(30) Foreign Application Priority Data

Oct. 17, 2005 (EP) .................................. 05022558

(51) Int. Cl.
*H02J 1/10* (2006.01)
(52) U.S. Cl. ........................................................ 307/44
(58) Field of Classification Search ................. 307/154, 307/43–45; 118/723 E; 313/231.31; 361/235
See application file for complete search history.

(56) References Cited

U.S. PATENT DOCUMENTS

| | | | | |
|---|---|---|---|---|
| 5,925,212 A * | 7/1999 | Rice et al. | .............. | 156/345.27 |
| 6,259,334 B1 | 7/2001 | Howald | | |
| 6,411,490 B2 * | 6/2002 | Dible | .......................... | 361/234 |
| 7,259,622 B2 * | 8/2007 | Coleman | .................... | 330/251 |
| 7,451,839 B2 * | 11/2008 | Perlman | ..................... | 180/2.1 |
| 2003/0215373 A1 | 11/2003 | Reyzelman et al. | | |
| 2004/0032212 A1 | 2/2004 | Yuzurihara et al. | | |

FOREIGN PATENT DOCUMENTS

EP  0 731 559  9/1996

(Continued)

OTHER PUBLICATIONS

Office Action from corresponding Japanese Application No. 2006-282962 dated Feb. 26, 2009, 7 pages.

(Continued)

*Primary Examiner*—Albert W Paladini
(74) *Attorney, Agent, or Firm*—Fish & Richardson P.C.

(57) ABSTRACT

The power output of an RF plasma supply device is controlled by producing at least a first and second RF power signal by means of a respective RF generator, coupling at least two RF power signals into a coupled RF power, and distributing the coupled RF power between a plasma power that is to be supplied to a plasma load and an equalizing power that is to be supplied to an equalizing load. The power output is controlled by adjusting the levels and/or the phase position of the RF power signals in such a manner that, for plasma power in the range between a predefined lower power limit and a predefined nominal power, an insignificant portion of the coupled RF power constitutes the equalizing power and, for plasma power below the predefined lower power limit, a significant portion of the coupled RF power constitutes the equalizing power.

27 Claims, 3 Drawing Sheets

FOREIGN PATENT DOCUMENTS

| | | |
|---|---|---|
| JP | 58-66702 | 5/1983 |
| JP | 2000091862 | 3/2000 |
| JP | 2001068770 | 3/2001 |
| JP | 2004074258 | 3/2004 |
| JP | 2004080846 | 3/2004 |
| JP | 2005094913 | 4/2005 |
| JP | 2005527078 | 9/2005 |
| KR | 1020020035249 | 5/2002 |
| KR | 1020040079127 | 9/2004 |
| WO | WO 01/08288 | 2/2001 |

OTHER PUBLICATIONS

Bill Andreycak, "Phase Shifted, Zero Voltage Transition Design Considerations and the UC3875 PWM Controller", Unitrode, Application Note, May 1997, pp. 1-14.

Notice of Decision for Patent in related Korean application 10-20060100279, May 21, 2008, 1 page issued by Korean Intellectual Property Office.

* cited by examiner

RF PLASMA SUPPLY DEVICE

CROSS REFERENCE TO RELATED APPLICATION

This application claims priority under 35 U.S.C. §119(a) from European Patent Application No. EP 05 022 558.0, filed Oct. 17, 2005, and under 35 U.S.C. §119(e) from U.S. Application No. 60/729,949, filed Oct. 25, 2005. Both of these priority applications are hereby incorporated by reference in their entirety.

TECHNICAL FIELD

The invention relates to a method for adjusting the power output of a radio frequency (RF) plasma supply device.

BACKGROUND

For RF plasma supply devices and/or the RF generators that are arranged within a plasma supply device, nominal power levels are stipulated by the manufacturer, where the sum of the nominal power levels of the individual RF generators constitutes the nominal power of the plasma supply device.

RF generators and consequently RF plasma supply devices can be operated with a greater level of difficulty at a fraction of their nominal power. RF generators and RF plasma supply device can tend towards uncontrolled fluctuations and can be controlled at a precise power output with greater difficulty. In most cases, a lower power limit is also stipulated by manufacturers of RF generators, below which the RF generator cannot be operated in a reliable manner or with the required level of precision. For example, some manufacturers stipulate that the lower power limit is 10% of the nominal power, while some manufacturers stipulate an even lower value such as 1% of the nominal power. Moreover, the sum of the lower power limits of the RF generators constitutes approximately the lower power limit of the plasma supply device.

In order to operate the plasma supply device below the lower power limit, a first portion of the power from the RF generator is supplied to an additional resistor and the remainder of the power from the RF generator is supplied to the load to enable operation of the RF generator above the lower power limit. To this end, the resistor can be connected in series or in parallel with the load. For power levels below the lower power limit, this solution in most cases provides a usable result.

SUMMARY

In one general aspect, a method for controlling the power output of an RF plasma supply device includes producing at least a first and second RF power signal, and coupling at least two RF power signals into a coupled RF power in dependence on the RF power signals. The method includes distributing the coupled RF power between a plasma power that is to be supplied to a plasma load and an equalizing power that is to be supplied to an equalizing load. The method further includes adjusting the RF power signals in such a manner that, for plasma power in the range between a predefined lower power limit and a predefined nominal power, an insignificant portion of the coupled RF power constitutes the equalizing power and, for plasma power below the predefined lower power limit, a significant portion of the coupled RF power constitutes the equalizing power.

Implementations can include one or more of the following features. For example, an insignificant portion of the coupled RF power can be less than about 10% of the coupled RF power. A significant portion of the coupled RF power can be greater than about 10% of the coupled RF power.

Adjusting the RF power signals can include adjusting levels, phase position, or both levels and phase position of the RF power signals. Adjusting the RF power signals can include adjusting the direct current supply, the direct voltage supply, or both the direct current supply and the direct voltage supply of RF power generators that produce the RF power signals.

For plasma power in the range between the predefined lower power limit and the predefined nominal power, an equalizing power can set that is lower than the equalizing power set for plasma power below the predefined lower power limit.

Producing the RF power signals can include driving switching elements in RF generators. Adjusting the RF power signals can include driving the switching elements in a phase-shift method.

The method can include coarsely adjusting the coupled RF power by controlling the direct current supply, the direct voltage supply, or both the direct current supply and the direct voltage supply of RF generators that produce the RF power signals, and finely adjusting the coupled RF power by carrying out a phase-shift control operation of the RF generators.

Coupling the RF power signals can include coupling the RF power signals in a 90° hybrid. Coupling the RF power signals can include coupling the RF power signals in a 3 dB coupler.

Producing at least a first and a second RF power signal can include producing more than two RF power signals, and coupling at least two RF power signals into a coupled RF power includes coupling two of the RF power signals into a first coupled RF power signal and coupling the first coupled RF power signal with a third signal into a load coupled RF power signal that provides the coupled RF power. Coupling the first coupled RF power signal with a third signal can include coupling the first coupled RF power signal with a third RF power signal.

The method can include producing a plurality of equalizing power levels for a plurality of equalizing loads.

Coupling the RF power signals can include adding the RF power signals in the coupling members. The coupling members can be arranged in a cascading manner.

The method can include measuring a variable that describes an RF power. Adjusting the RF power signals can include using the variable that describes the RF power. The method can include impedance matching the plasma power that is to be supplied to the plasma load.

In another general aspect, an RF plasma supply device for supplying a plasma load with plasma power includes at least two RF generators for producing a first and a second RF power signal, at least one coupling member in which a coupled RF power is produced from the RF power signals. The coupling member has a first output connected to the plasma load and a second output connected to an equalizing load. The RF plasma supply device includes a control device coupled to the RF generators to control the RF power signals in such a manner that, for plasma power in the range between a predefined lower power limit and a predefined nominal power, an insignificant portion of the coupled RF power is distributed to the equalizing load and, for plasma power below the predefined lower power limit, a significant portion of the coupled RF power is distributed to the equalizing load.

Implementations can include one or more of the following features. For example, the at least one coupling member can include an input that is directly coupled to one of the RF power signals. The at least one coupling member can include an input that is directly coupled to an output of another coupling member that includes an input that is directly coupled to one of the RF power signals.

The coupling member can be a 90° hybrid. The coupling member can be a 3 dB coupler.

The RF plasma supply device can include more than two RF generators for producing more than two RF power signals, and at least two coupling members that are arranged in a cascading manner.

The RF plasma supply device can include at least one measuring device for measuring a variable that describes an RF power. The RF plasma supply device can include at least one DC power supply coupled to the RF generators and the control device.

The object is achieved with a method of the type mentioned above, adjustment (by way of open-loop and/or closed-loop control) of the levels and/or the phase position of the RF power signals being carried out in such a manner that, for plasma power in the range between a predefined lower power limit and a predefined nominal power, an insignificant portion of the coupled RF power constitutes the equalizing power, and, for plasma power below the predefined lower power limit, a significant portion of the coupled RF power constitutes the equalizing power. Using this method, it is possible to operate a plasma supply device in a stable manner over a wide power range, in particular also when operating below the lower power limit. A large power range can be readily covered and passed through in a substantially continuous manner. The RF power generators are preferably controlled in such a manner that all of them output approximately the same RF power.

For plasma power in the range between a predefined lower power limit and a predefined nominal power level, a lower equalizing power is preferably set than for plasma power below the predefined lower power limit. The lower power limit can, for example, be predefined in dependence on the nominal power level. For example, it is possible to predefine a power level in the range of from 0.1% to 20% of the nominal power as the lower power limit. The lower power limit is preferably predefined as approximately 10% of the nominal power.

The levels and/or phases of the RF power signals, in particular when the RF plasma supply device is operated in the range of the nominal power, can be adjusted by the direct current and/or direct voltage supply of the RF power generators being controlled and/or regulated. Thus, the plasma power can be adjusted in a particularly simple manner in a power range above the lower power limit. In one example, the RF plasma supply device includes two RF generators and a coupling member for adding the RF power signals. The nominal power of each RF generator is, for example, 1.5 kW; they both operate, for example, at 13.56 MHz. If the RF plasma supply device operates in the range >10% of the nominal power thereof, the phase position and the levels of the two RF generators are adjusted in such a manner that all the coupled RF power is supplied to the plasma load if possible. This amounts to 3 kW at nominal power. The power level is controlled, for example, by controlling the direct current or direct voltage supply of the RF generators. If the RF plasma supply device operates in the range <10% of its nominal power, that is to say, less than 300 W plasma power, the plasma power is then preferably no longer controlled necessarily by controlling the levels of the RF power signals of the RF generators (for example, by controlling the direct voltage or direct current supply), but instead preferably primarily by controlling the phase position of the two RF generators relative to each other.

The RF power signals can be produced by driving switching elements in the RF generators. RF generators that operate in switching mode have particularly low levels of loss and can be used for relatively high power levels. RF generators that operate in switching mode include, for example, class D (full bridges or half bridges) or class E, F amplifiers or a mixture of forms thereof. This type of RF generator has one or more switching elements and an output circuit. The switching elements are switched on and off with a switching signal of a switching frequency.

The output circuit substantially has two functions: first, filtering the RF power signal so that substantially only the switching frequency reaches the output, and second, enabling the switching elements to be connected in a manner that reduces losses. The power output of the individual RF generator can be controlled, for example, by the direct voltage or the direct current supply. The RF generators that operate in switching mode operate at frequencies above 1 MHz, generally with MOSFETs as switching elements. These MOSFETs have an output capacitance Coss that is dependent in a non-linear manner on the voltage at the output of the MOSFET between the drain and the source connection. While the capacitance for high output voltages (for example, greater than 100V) decreases only slightly as the voltage increases, the capacitance at low output voltages (for example, less than 40V) increases very significantly as voltages decrease and can become greater by factors (for example, by a factor of 100 or 1000) than the value at high voltages. This renders the operation of RF generators that operate in switching mode complex at low voltages, in particular when they are actually designed to operate at high voltages since the capacitance always acts on the output circuit of the RF generators operating in switching mode. However, if a value in the circuit changes very significantly, this changes the behavior of the output circuit and it can no longer carry out its two functions at all or not carry them out correctly. Adjustment of the power at power outputs that are low in relation to the nominal power therefore becomes very complicated. For many applications in vacuum plasma processes, however, a very precise power adjustment is required over a very wide range, in particular for power levels that are far lower than the nominal power of the RF plasma supply device. An additional problem is that the dC/dV change is very large at low voltages. This leads to occurrences of non-linearity in the behavior of the output circuit.

This explanation makes it clear that the value for the lower power limit is generally not strictly 10% of the nominal power but can instead change in the range from 0.1% to 20% of the nominal power depending on the desired nominal power and the lowest desirable power to be adjusted. Significant in RF power generators that operate in switching mode is the non-linearity of the output capacitance and the tolerance of the circuit that is also dependent on the maximum voltage at the switching element, the frequency, the power level, etc.

The levels and/or phases of the RF power signals can be adjusted by driving the switching elements in a phase-shift method. For example, an RF generator can have two half bridges that each include two mutually switching elements. By controlling the switching elements, the phase position of the half bridges and therefore the power at the output of the RF generator are adjusted. Using this principle of power regulation, it is still not possible to adjust very low power levels in a sufficiently precise manner. Adjustment of the power that is to be supplied to an equalizing load is therefore also advantageous when producing the RF power signals in this manner in order to be able to operate the entire RF plasma supply device in a reliable manner.

It is particularly preferable for a coarse adjustment of the coupled RF power to be carried out by adjusting (by open-loop and/or closed-loop control) the direct current and/or the direct voltage supply of the RF generators and a fine adjustment of the coupled RF power to be carried out by carrying out a phase-shift control operation of the RF generators. It is thereby possible to adjust the plasma power level with a very high level of precision for operating the RF plasma supply device both below and above the lower power limit. In addition, it is possible to switch off individual RF generators and operate the remaining RF generators above their own lower power limit. In particular, it is possible to adjust the power output of the RF plasma supply device when operating below the lower power limit exclusively by means of the power distribution.

As discussed herein, the RF power signals from the RF generators can be coupled in a 90° hybrid, for example, a 3 dB coupler. Using these couplers, it is possible to prevent multiple reflections in the case of incorrect matching with the plasma load. This means that the RF generators that are connected upstream of the 90° hybrid can be protected in an effective manner. Furthermore, a 90° hybrid can be regulated at low power levels. With some power couplers, such as, for example, the 90° hybrids, coupling the RF power (input) signals involves adding the RF power signals to form an added RF power as a coupled RF power. The added RF power is then distributed, depending on the level and/or phase position of the RF power signals, between two RF power (output) signals.

Larger plasma power can be produced if more than two RF power signals are produced, two RF power signals being coupled into a coupled RF power signal in each case. The coupling or addition of the RF power signals can be carried out in a coupling member so that a plurality of equalizing loads are also provided and, correspondingly, a plurality of equalizing power levels. Two RF power signals can be arranged in a coupling members in each case. A plurality of coupling members can be arranged in a cascading manner so that, at the end of the cascade, an RF power signal is produced that constitutes the plasma power to be supplied to a plasma load.

The RF power signals or variables at the output of at least one RF generator can be measured that estimates or describes the RF power. Alternatively or additionally, a variable can be determined that describes the plasma power and/or the equalizing power. Examples of variables that describe an RF power include the power itself or a voltage and/or a current.

The variable that describes the RF power can be used to regulate (that is, to adjust in a closed-loop manner) the measured RF power or another RF power. It is thus possible to use, for example, a variable measured in an RF generator to regulate the RF power supplied by this generator. Furthermore, the determined plasma power can be used to regulate the RF power of one or more RF generators. The measured variables that describe an RF power can be supplied to a control device.

In one implementation, an impedance matching operation can be carried out, for example, between the plasma load and the plasma supply device.

In another general aspect, an RF plasma supply device for supplying a plasma load with plasma power includes at least two RF generators for producing a first and a second RF power signal, at least one coupling member in which a coupled RF power level is produced from two RF power signals, and a control device that adjusts levels associated with the RF generators. The plasma load and a equalizing load are connected or are able to be connected to the at least one coupling member. The control device is configured to carry out the method described above and/or the method variants thereof.

The method described above can be implemented in hardware, firmware, and/or software. The advantage of an implementation in hardware is that it is possible to regulate power in a rapid, stepless manner. With an implementation in firmware or in software, the control or regulation can be readily configured and can be adjusted in a reliable and cost efficient manner with minimal complexity in terms of maintenance.

In one implementation, the control device has a first control unit for controlling the power distribution for coupled RF power above the lower power limit and a second control unit for controlling the power distribution for coupled RF power below the lower power limit. The first control unit can be used in particular for controlling the direct current supply of the RF generators and/or a phase-shift control unit and the second control unit can be used for controlling the phase position of the RF generators. The second control unit can distribute a significant portion (for example, over 10%, or over 20% of the coupled RF power) of the coupled RF power to the equalizing load.

The coupling member can be constructed as a 90° hybrid, for example, as a 3 dB coupler. Using a coupling member of this type, it is possible to dispense with the connection and disconnection of a resistor that has been used in prior devices. Furthermore, a 90° hybrid reduces multiple reflections that can have a negative effect on the RF generators.

A larger power spectrum can be covered and higher nominal power levels can be achieved if the RF plasma supply device includes more than two RF generators and at least two coupling members. The at least two coupling members can be arranged in a cascading manner. Furthermore, the interference suppression is increased proportionally with each cascading arrangement of 90° hybrids in the case of incorrect matching with the plasma load.

If at least one measuring device is provided for measuring a variable that describes an RF power, it is possible not only to control the power using predefined power values but also to regulate it since a closed-loop feedback is possible. The measuring devices are therefore preferably connected to the control device.

In another implementation, the RF plasma supply device can include at least one DC power supply for the RF generators. The DC power supply is controlled by the control device in an open-loop and/or a closed-loop manner. The levels of the RF power signals can thereby be adjusted in a particularly simple manner. It is possible to provide a DC power supply for a plurality of RF generators or an individual DC power supply can be provided for each RF generator.

The RF plasma supply device is able to operate below the power limit without having to rapidly disconnect or continuously adjust a resistor. The RF plasma supply device can continuously and precisely adjust the RF power over a wide range.

Further features and advantages of the invention will be appreciated from the following description, the drawings, and the claims. The individual features can be implemented individually or together in any combination in a variant of the invention. The embodiments shown and described are not to be understood as exhaustive enumeration but have exemplary character for describing the invention.

DETAILED DESCRIPTION

Figure 1:
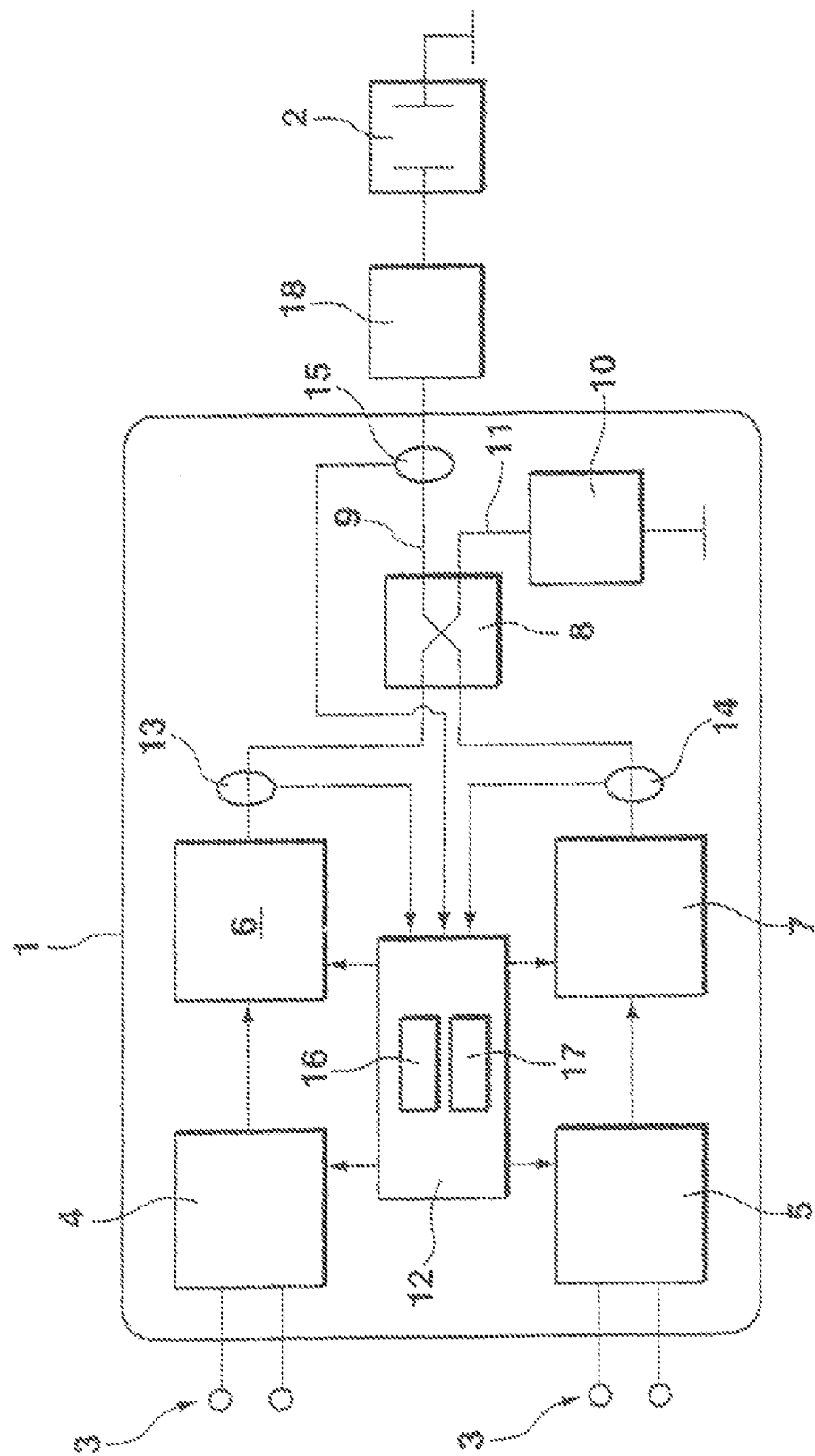
FIG. 1 is a diagram of a first configuration of an RF plasma supply device according to the invention.

FIG. 1 illustrates an RF plasma supply device 1 in which a plasma power level is produced in order to supply a plasma load 2. The plasma load 2 can be a vacuum plasma processing chamber, that is used, for example, for coating, etching, or processing substrates by means of a plasma, a plasma process that is carried out therein, or a laser excitation with a gas laser. The plasma supply device 1 operates at RF frequencies in the range of about 1 to about 30 MHz, and for plasma loads, can operate at RF frequencies in the range of about 13 to about 27 MHz.

The RF plasma supply device 1 is connected, by means of a network connection 3, to a power supply network that can be single or multi-phase. The network connection 3 can be constructed as a plug-in contact. The network connection 3 is connected to DC power supplies 4, 5. Each DC power supply 4,5 is associated with an RF generator 6, 7 respectively, such that the DC power supply 4, 5 supplies the RF generator 6,7 with a direct current or a direct voltage, Alternatively, it is also possible to provide a common direct current supply for both RF generators 6, 7. The nominal power of each RF generator 6, 7 can be about 1.5 kW, with operation frequencies of about 13.56 MHz. As discussed above, a lower power limit is stipulated by manufacturers of the RF generators 6, 7, below which the RF generator 6, 7 cannot be operated in a reliable manner or with the required level of precision.

Each of the RF generators 6, 7 generates an RF power signal that can be supplied to a coupling member 8 that can be constructed as a 90° hybrid. The RF power signals are coupled into a coupled RF power in the coupling member 8. The 90° hybrid can be a 3 dB coupler that can prevent multiple reflections in situations of incorrect matching with the plasma load. Generators that are connected upstream of the 90° hybrid can be protected. Moreover, the 90° hybrid allows the power to be regulated at low power levels. If the coupling member 8 is a 90° hybrid, then the RF power signals from the RF generators 6, 7 are added to form a coupled RF power. For example, the coupled RF power is the sum of the RF power signals from the RF generators 6, 7 if the RF power signals are offset by 90°.

The coupling member 8 distributes the coupled RF power between the outputs 9 and 11. A plasma power that is to be supplied to the plasma load 2 is produced at the output 9 and an equalizing power that is to be supplied to an equalizing load 10 is produced at the output 11. Depending on the phase position of the RF power signals, the coupled RF power is distributed differently between the outputs 9, 11. The coupled RF power is almost completely transferred to the output 9 if the RF power signals of the RF generators 6, 7 are in phase quadrature.

The RF plasma supply device 1 includes a control device 12 that controls both the DC power supplies 4, 5 and the RF generators 6, 7 in an open-loop or a closed-loop manner. The RF power signal from the RF generators 6, 7 can be adjusted by the direct current and/or direct voltage supply from the DC power supplies 4, 5 as controlled by the control device 12. The control of the DC power supplies 4, 5 and the RF generators 6, 7 is carried out in such as manner that, when the RF plasma supply device 1 is operated for a plasma power that is in the range between a lower power limit and a predefined nominal power, the majority of the coupled RF power is supplied to the output 9 and therefore the plasma load 2, and only an insignificant portion of the coupled RF power is supplied to the equalizing load 10. In this operating range, the RF generators 6, 7 are also operated between the lower power limit and the nominal power thereof. To this end, the signal level at the outputs of the RF generators 6,7 can be adjusted by controlling (using an open-loop method) or regulating (using a closed-loop method) the DC power supplies 4, 5. Alternatively, or in addition, the RF generators 6, 7, which are constructed as RF generators that operate in switching mode, can be controlled by means of a phase-shift method in order to influence the level of the RF power signals. For example, if the lower power limit is 10% of the nominal power, and the RF plasma supply device 1 operates above the lower power limit, the phase position and the levels of the RF generators 6, 7 are adjusted in such a manner that all the coupled RF power supplied to the plasma load 2 is about 3 kW at nominal power.

When the RF plasma supply device 1 is operated in a power range below the lower power limit, the RF generators 6, 7 can be controlled by the control device 12 in such a manner that the RF power signals have a phase position in which a majority of the coupled RF power is supplied to the equalizing load 10 and only a small portion of the coupled RF power is supplied to the plasma load 2. If the lower power limit is 10% of the nominal power, and the RF plasma supply device 1 operates below the lower power limit, which can be less than about 300 W plasma power, than the RF power signal can be controlled primarily by controlling the phase position of the RF generators 6, 7 relative to each other, and it is not necessary to control the direct voltage or direct current supply from the DC power supplies 4, 5.

The RF plasma supply device 1 also includes measuring devices 13, 14, 15 that are used for determining variables that describe an RF power. The measuring devices 13, 14, 15 transmit the variables to the control device 12 so that it is possible to regulate (by way of a closed-loop method) one or more RF power levels. The control device 12 has a first control unit 16 that is used to control the plasma power and the equalizing power in a power range between the lower power limit and the nominal power, and a second control unit 17 that is used for power regulation in a lower power range. An impedance matching unit 18 is arranged between the output 9 and the plasma load 2.

Figure 2:
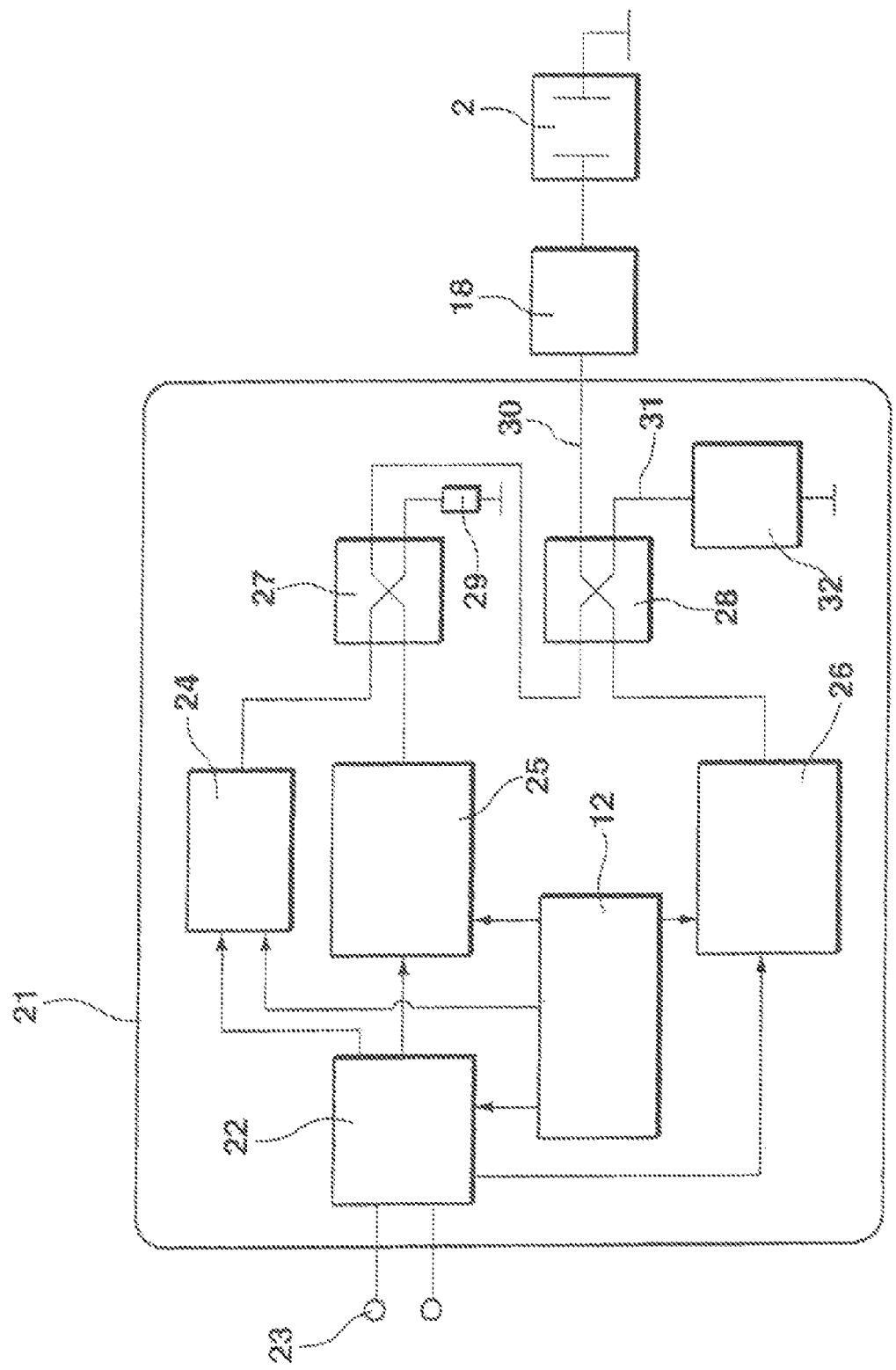
FIG. 2 is a diagram of a second configuration of an RF plasma supply device.

In the RF plasma supply device 21 of FIG. 2, a DC power 22 is connected to a network connection 23. The DC power supply 22 supplies three RF generators 24, 25, 26 with a direct current and/or a direct voltage. The RF power signals produced in the RF generators 24, 25 are coupled into a first coupled RF power in a first coupling member 27. A first portion of the first coupled RF power from the first coupling member 27 is transferred to a second coupling member 28, and the remainder of the first coupled RF power is supplied to a first equalizing load 29. The distribution of the first coupled RF power is dependent on the phase position of the RF power signals produced by the RF generators 24, 25. In the second coupling member 28, the first portion of the first coupled RF power (that is, the power output or the RF power signal transmitted) at the output of the first coupling member 27 is coupled to the RF power signal produced in and output by the RF generator 26, and the second coupling member 28 produced a second coupled RF power. Depending on the phase position of the RF power signal transmitted by the first coupling member 27 and the RF power signal output by the RF generator 26, the second coupled RF power is distributed between a plasma power that is supplied to the plasma load 2 by way of the output 30 of the second coupling member 28, and an equalizing power that is supplied to a second equalizing load 32 by way of the output 31.

The control device 12 controls the DC power supply 22 and the RF generators 24 to 26. The control device 12 can control by way of an open-loop control system. Alternatively, the control device 12 can regulate by way of a closed-loop control system. Measuring devices (such as the measuring devices 13, 14, 15 of FIG. 1) are not illustrated in FIG. 2 for reasons of clarity. The coupling member 28 is arranged downstream of the coupling member 27. The coupling members 27, 28 are consequently arranged in a cascading manner.

Figure 3:
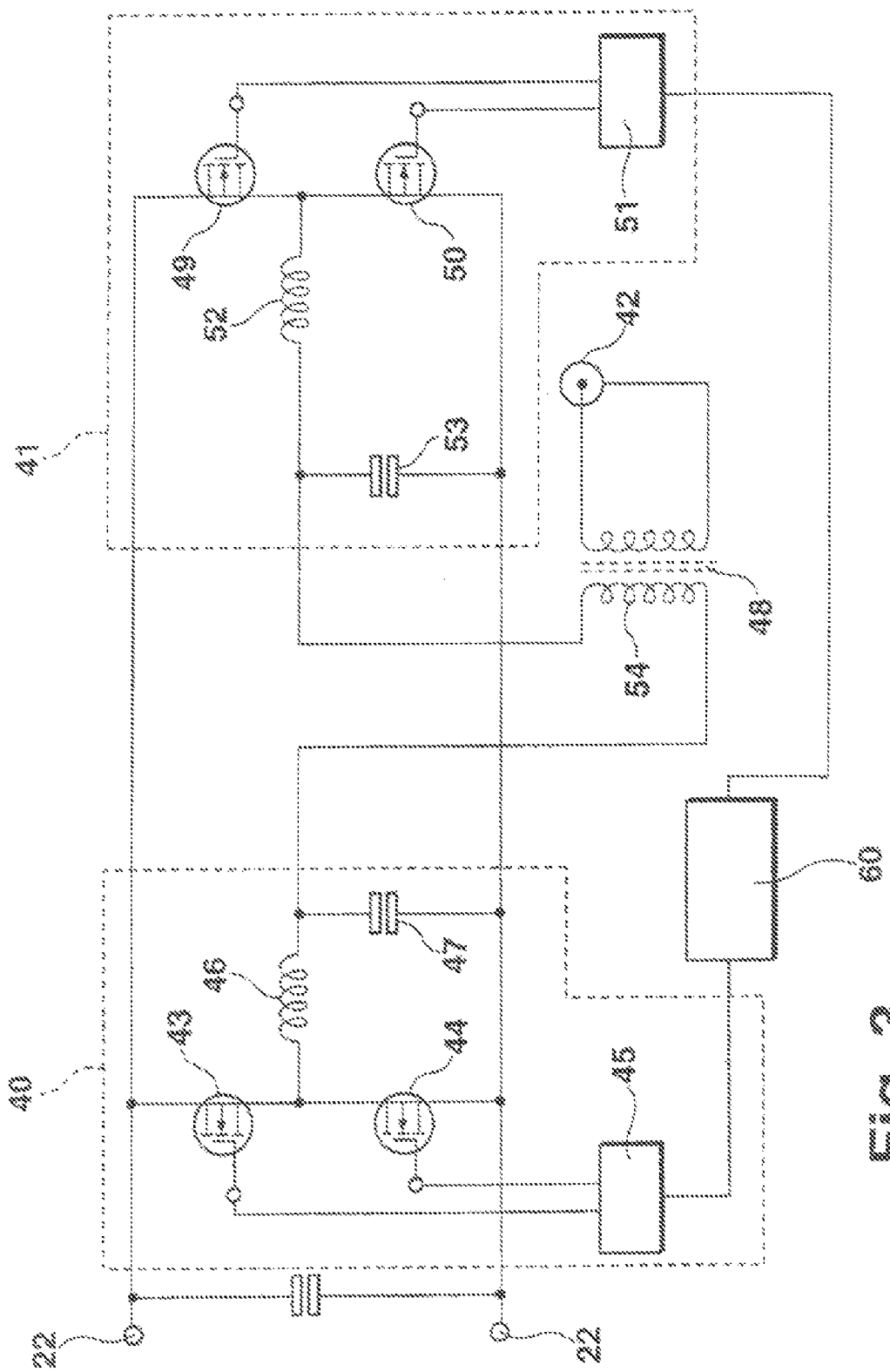
FIG. 3 is an illustration of an RF generator to illustrate a phase-shift control unit.

FIG. 3 illustrates the RF generator 6 in detail. The RF generator 6 has two components 40, 41 that are arranged in accordance with a full bridge circuit. The circuit according to FIG. 3 allows the power at the output 42 to be adjusted by the phase between the switching signals that are supplied to the two halves 40, 41 being varied. The first component 40 includes a pair of switching elements 43, 44 that receive a pair of switching signals that are transmitted by a signal source 45. The switching elements 43, 44 are connected in series between the negative and positive terminals of the DC power supply 22. The output of the switching elements 43, 44 is connected to an inductor 46 that is part of an output oscillating circuit. The output oscillating circuit is formed by the inductor 46 and the capacitor 47. The output of the first component 40 is connected to a first tap of a transformer 48.

The second component 41 includes a pair of switching elements 49, 50 and a signal source 51. The signal source 51 transmit a pair of switching signals that are transmitted to the switching elements 49, 50. The signal sources 45, 51 can also be combined in a single unit. The second component 41 also includes an output oscillating circuit having an inductor 52 and a capacitor 53. The second component 41 is connected to the second tap of the transformer 48. The transformer 48 produces galvanic isolation between the components 40, 41 and the output 42. The components 40, 41 are connected in series by a primary winding 54 of the transformer 48. The components 40, 41 are connected in series so that changing the phase between the switching signals that control each component 40, 41 varies the power at the output 42. If the switching elements 43, 49 are activated and deactivated at the same times, they operate in phase. However, if the switching element 43 is always switched off when the switching element 49 is switched on, and the switching element 43 is always switched on when the switching element 49 is switched off, the switching elements are not in phase, and are in phase opposition.

The phase position between the components 40, 41 is determined by a phase control unit 60 that is a part of the control and/or regulation device 12, and in one implementation, a part of the control unit 16. The phase control unit 60 controls the signal sources 45, 51 in order to adjust the phase shift or the phase position between the two components 40, 41. A maximum power level or a maximum level of the RF power signal is achieved at the output 42 if the components 40, 41 are operated in phase opposition. The lowest power output is achieved if the components 40, 41 are operated in phase. In this instance, each component 40, 41 operates under zero-load conditions regardless of the load impedance. The power adjustment illustrated with reference to FIG. 3 at the output 42 is a power adjustment in the phase-shift method.

In one example, the RF generators can operate at frequencies above 1 MHz and the switching elements 43, 44, 49, 50 can be MOSFETs that have an output capacitance Coss that is dependent in a non-linear manner on the voltage at the output of the MOSFET between the drain and the source connection. While the capacitance for high output voltages (for example, greater than 100V) decreases only slightly as the voltage increases, the capacitance at low output voltages (for example, less than 40V) increases very significantly as voltages decrease and can become greater, for example, by factors of 100 or 1000, than the value at high voltages.

In another implementation, the RF plasma supply device includes four RF generators A, B, C, D, that each produce an RF power signal. In this case, the RF plasma supply device can include three coupling members X, Y, Z. The coupling member X couples the RF power signals from generators A and B into a coupled RF power signal x and the coupling member Y couples the RF power signals from generators C and D into a coupled RF power signal y. The coupling member Z couples the coupled RF power signals x and y into an RF power signal z that is either supplied to the plasma load 2 or to the equalizing load 10, as discussed in detail above. In the RF plasma supply device having four generators A, B, C, D, the remaining components would be similar to those components found in the RF plasma supply device 1. In particular, each of the RF generators A, B, C, D could be connected to a DC power supply such as the DC power supplies 4, 5 and could couple to a control device such as the control device 12.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method for controlling the power output of an RF plasma supply device, the method comprising:
producing at least a first and a second RF power signal;
coupling at least two RF power signals into a coupled RF power in dependence on the RF power signals;
distributing the coupled RF power between a plasma power that is to be supplied to a plasma load and an equalizing power that is to be supplied to an equalizing load; and
adjusting the RF power signals in such a manner that, for plasma power in the range between a predefined lower power limit and a predefined nominal power, an insignificant portion of the coupled RF power constitutes the equalizing power and, for plasma power below the predefined lower power limit, a significant portion of the coupled RF power constitutes the equalizing power.

2. The method of claim 1 wherein an insignificant portion of the coupled RF power is less than about 10% of the coupled RF power.

3. The method of claim 1 wherein a significant portion of the coupled RF power is greater than about 10% of the coupled RF power.

4. The method of claim 1, wherein adjusting the RF power signals includes adjusting levels, phase position, or both levels and phase position of the RF power signals.

5. The method of claim 1, wherein, for plasma power in the range between the predefined lower power limit and the predefined nominal power, an equalizing power is set that is lower than the equalizing power set for plasma power below the predefined lower power limit.

6. The method of claim 1 wherein adjusting the RF power signals includes adjusting the direct current supply, the direct voltage supply, or both the direct current supply and the direct voltage supply of RF power generators that produce the RF power signals.

7. The method of claim 1, wherein producing the RF power signals includes driving switching elements in RF generators.

8. The method of claim 7, wherein adjusting the RF power signals includes driving the switching elements in a phase-shift method.

9. The method of claim 1, further comprising:
coarsely adjusting the coupled RF power by controlling the direct current supply, the direct voltage supply, or both the direct current supply and the direct voltage supply of RF generators that produce the RF power signals, and
finely adjusting the coupled RF power by carrying out a phase-shift control operation of the RF generators.

10. The method of claim 1, wherein coupling the RF power signals includes coupling the RF power signals in a 90° hybrid.

11. The method of claim 10, wherein coupling the RF power signals includes coupling the RF power signals in a 3 dB coupler.

12. The method of claim 1, wherein:
producing at least a first and a second RF power signal includes producing more than two RF power signals, and
coupling at least two RF power signals into a coupled RF power includes coupling two of the RF power signals into a first coupled RF power signal and coupling the first coupled RF power signal with a third signal into a load coupled RF power signal that provides the coupled RF power.

13. The method of claim 12, wherein coupling the first coupled RF power signal with a third signal includes coupling the first coupled RF power signal with a third RF power signal.

14. The method of claim 1, further comprising producing a plurality of equalizing power levels for a plurality of equalizing loads.

15. The method of claim 1, wherein coupling the RF power signals includes adding the RF power signals in coupling members.

16. The method of claim 15, wherein the coupling members are arranged in a cascading manner.

17. The method of claim 1, further comprising measuring a variable that describes an RF power.

18. The method of claim 17, wherein adjusting the RF power signals includes using the variable that describes the RF power.

19. The method of claim 1, further comprising impedance matching the plasma power that is to be supplied to the plasma load.

20. An RF plasma supply device for supplying a plasma load with plasma power, the device comprising:
at least two RF generators for producing a first and a second RF power signal,
at least one coupling member in which a coupled RF power is produced from the RF power signals, and having a first output connected to the plasma load and a second output connected to an equalizing load, and
a control device coupled to the RF generators to control the RF power signals in such a manner that, for plasma power in the range between a predefined lower power limit and a predefined nominal power, an insignificant portion of the coupled RF power is distributed to the equalizing load and, for plasma power below the predefined lower power limit, a significant portion of the coupled RF power is distributed to the equalizing load.

21. The RF plasma supply device of claim 20, wherein the at least one coupling member includes an input that is directly coupled to one of the RF power signals.

22. The RF plasma supply device of claim 20, wherein the at least one coupling member includes an input that is directly coupled to an output of another coupling member that includes an input that is directly coupled to one of the RF power signals.

23. The RF plasma supply device of claim 20, wherein the coupling member is a 90° hybrid.

24. The RF plasma supply device of claim 20, wherein the coupling member is a 3 dB coupler.

25. The RF plasma supply device of claim 20, wherein the RF plasma power supply device includes:
more than two RF generators for producing more than two RF power signals, and
at least two coupling members that are arranged in a cascading manner.

26. The RF plasma supply device of claim 20, further comprising at least one measuring device for measuring a variable that describes an RF power.

27. The RF plasma supply device of claim 20, further comprising at least one DC power supply coupled to the RF generators and the control device.

* * * * *